(12) United States Patent
Kim

(10) Patent No.: US 7,402,761 B2
(45) Date of Patent: Jul. 22, 2008

(54) ELECTRIC CONDUCTIVE GASKET

(75) Inventor: Sun-Ki Kim, Kyeonggi-do (KR)

(73) Assignee: Joinset Co., Ltd. (KR)

( * ) Notice: Subject to any disclaimer, the term of this patent is extended or adjusted under 35 U.S.C. 154(b) by 0 days.

(21) Appl. No.: 11/441,937

(22) Filed: May 26, 2006

(65) Prior Publication Data

US 2006/0213687 A1    Sep. 28, 2006

Related U.S. Application Data

(63) Continuation of application No. PCT/KR2004/002280, filed on Sep. 8, 2004.

(30) Foreign Application Priority Data

Nov. 28, 2003  (KR)  ............... 2003/85375
Jul. 30, 2004   (KR)  ............... 2004/60202

(51) Int. Cl.
    *H05K 9/00*    (2006.01)
(52) U.S. Cl. ............. 174/357; 174/356; 174/358; 277/920
(58) Field of Classification Search ............ 174/356, 174/357, 358; 439/88, 927; 277/919, 920
    See application file for complete search history.

(56) References Cited

U.S. PATENT DOCUMENTS

| | | | | | |
|---|---|---|---|---|---|
| 4,857,668 | A | * | 8/1989 | Buonanno | 174/354 |
| 4,901,738 | A | * | 2/1990 | Brink et al. | 128/849 |
| 6,214,454 | B1 | * | 4/2001 | Kanda et al. | 428/294.7 |
| 6,217,978 | B1 | | 4/2001 | Murase et al. | 428/116 |
| 6,225,556 | B1 | | 5/2001 | Saito | 174/36 |

FOREIGN PATENT DOCUMENTS

| | | | |
|---|---|---|---|
| JP | 02014599 | * | 1/1990 |
| KR | 100315048 | | 11/2001 |
| KR | 20 0274704 | | 5/2002 |

OTHER PUBLICATIONS

International Search Report; Dec. 17, 2004; 2 pages.

* cited by examiner

*Primary Examiner*—Hung V Ngo
(74) *Attorney, Agent, or Firm*—Tuchman & Park LLC

(57) ABSTRACT

Disclosed is an electric conductive gasket including: an electric conductive sheet having a natural pulp base, a soft aluminum foil adhered to a surface of the natural pulp base with an adhesive being interposed therebetween, and a hot melt layer formed on the other surface of the natural pulp base; and a nonconductive elastic member overlapped to be continuously encompassed by the electric conductive sheet, to be adhered by the hot melt layer.

14 Claims, 5 Drawing Sheets

ELECTRIC CONDUCTIVE GASKET

CROSS-REFERENCE TO RELATED APPLICATIONS

The present application is a continuation of pending International Patent Application PCT/KR2004/002280 filed on Sep. 8, 2004 which designates the United States and claims priority of Korean Patent Application No. 2003/85375 filed on Nov. 28, 2003 and Korean Patent Application No. 2004/60202 filed on Jul. 30, 2004.

FIELD OF THE INVENTION

The present invention relates to an electric conductive gasket, and more particularly, to an electric conductive gasket using a soft aluminum foil and a natural pulp to provide environmental friendliness, reduce an electric resistance, and reduce a manufacturing cost.

BACKGROUND OF THE INVENTION

As an electronic communication is developed and an information society is built, modern home appliance, industrial electronic device and information communication equipment are required to have fast processing and low consumption power. According to the above requirements, equipments themselves are miniaturized, and a circuit is integrated to allow many devices to be installed in a small space. Accordingly, the devices are gradually placed in an environment where they tend to be influenced by an electronic wave noise and heat. Various counterplans are set to solve the above problem.

Equipment has a main part such as a connection part of the equipment, a cable, a transparent display plate or a connector connection part or the like where the leakage and the infiltration of an electronic wave are generated. In order to shield the electronic wave of the cable, the cable is shielded or grounded itself and a wire of the cable, that is, a core is used as a twisted core. Further, in order to shield the electronic wave from the transparent display plate, the transparent display plate is manufactured using a transparent insulating material such as acryl, and a metal fabric mesh or a conductive mesh is disposed within the transparent display plate, or a transparent conductive material is vacuum-deposited onto one side surface of the transparent display plate.

Such parts can shield the electronic wave to some degrees, but it is not easy that the connection part of the equipment satisfactorily shields the electronic wave.

The connection part shields the electronic wave to prevent an electronic wave, which is generated at the external of the equipment, from being infiltrated into the equipment via the atmosphere or prevent an electronic wave, which is generated at the internal of the equipment, from being leaked out from the equipment. In order to maximize the shielding of the connection part against the electronic wave, it is optional to design the connection part without seam, but it is impossible that the connection part does not have the seam. Accordingly, the connection part necessarily accompanies the infiltration or the leakage of the electronic wave. An electronic conductive gasket is used to prevent the infiltration or the leakage of the electronic wave. The gasket with a low electric resistance has an excellent electronic wave shielding effect and an excellent grounding effect at a high frequency.

As the electric conductive gasket, there are a finger gasket using beryllium or copper, an electric conductive silicon gasket manufactured by mixing and curing a metal powder with nonconductive silicon, and a knitting gasket having an electric conductive wire knitted on nonconductive urethane or silicon.

However, a most popularized gasket is an electric conductive fabric gasket having a nonconductive urethane sponge encompassed using an electric conductive fabric. A method of manufacturing the electric conductive fabric gasket is described as follows. Nylon or polyester fabric is nonelectrolytic-plated using nickel, copper, silver or aurum to manufacture the electric conductive fabric, and then a nonconductive polymer hot melt is coated on one side surface of the electric conductive fabric. After that, if the result is heated while encompassing a urethane sponge, a hot melt is molten to be in contact with the urethane sponge.

The electric conductive fabric gasket has a drawback in that the nickel, copper, silver or aurum non-electrolytically plated on the nonconductive fabric are expensive, thereby increasing a manufacture cost.

In order to solve the above drawback, a low-priced aluminum can be used for nonelectrolytic-plating. However, aluminum cannot be nonelectrolytically plated since it concurrently has properties of a positive ion and a negative ion. That is, since nickel, copper, silver and aurum are metals with a property of the positive ion, they can be nonelectrolytically plated, but aluminum cannot be nonelectrolytically plated since it is a metal having both properties.

Further, the electric conductive fabric gasket has a drawback in that since a harmful chemical component is generated as a pollution material when the fabric is nonelectrolytic-plated, it is not environment-friendly.

Furthermore, the electric conductive fabric gasket has a drawback in that since cloths are treated in a manufacture process, pollution such as dust is generated to deteriorate a work environment.

Additionally, the electric conductive fabric gasket has a drawback in that when nickel is used as a plating metal, a skin trouble such as allergy is generated, and when copper is used as the plating metal, the copper is discolored.

Further, the electric conductive fabric gasket has a drawback in that since the electric conductive fabric gasket is formed using the fabric, the fabric gets loose at a cut section surface, and since the plating of nickel or copper is performed at a limited thickness to have flexibility, the electric resistance is high and the thermal conductivity is poor.

An object of the present invention is to provide an electric conductive gasket with a low manufacture cost, an excellent electronic-wave shielding characteristic and grounding effect, and an environment-friendship.

Other objects and features of the invention will be more apparently understood in the following described embodiment.

SUMMARY OF THE INVENTION

To accomplish the above objects and advantages, there is provided an electric conductive gasket including: an electric conductive sheet having a natural pulp base, a soft aluminum foil adhered to a surface of the natural pulp base with an adhesive being interposed therebetween, and a hot melt layer formed on the other surface of the natural pulp base; and a nonconductive elastic member overlapped to be continuously encompassed by the electric conductive sheet, to be adhered by the hot melt layer.

Preferably, the natural pulp base has a natural pulp nonweaven fabric or a natural pulp paper, and the electric conductive sheet has a thickness of 150 μm or less, and the natural pulp base has a thickness greater than the aluminum foil.

In one embodiment, the natural pulp base has a thickness of 40 µm to 130 µm, the aluminum foil or an aluminum alloy foil has a thickness of 5 µm to 15 µm, and the adhesive has a thickness of 2 µm to 3 µm.

Further, the elastic member is a polymer sponge having a urethane sponge or a latex sponge.

Preferably, the electric conductive sheet has a wholly embossed surface in a state where the aluminum foil, the natural pulp base and the adhesive are integrally adhered to one another.

Further, an oxidation preventing film is formed on an entire surface of the aluminum foil, and preferably has a thickness of about 29 Å.

Preferably, the aluminum foil is formed of a purity of 99% or more of aluminum.

Preferably, the hot melt layer can be formed by arraying hot melt in a dot shape.

The electric conductive sheet has the aluminum foil adhered to the surface of the natural pulp base by using the adhesive, and the hot melt layer formed on the other surface of the natural pulp base. The electric conductive sheet is at a half-price or less of the conductive fabric. Accordingly, the electric conductive gasket manufactured using the electric conductive sheet is advantageously cheaper than the conventional gasket using the conductive fabric.

Further, since the adherence of the aluminum foil to the natural pulp base using the adhesive is a technique well known in the art, a particular equipment or technology is not needed and does not cause the pollution.

Furthermore, since the base is formed using the natural pulp paper, the electric conductive sheet gets loose less than a product having a cut section surface of the fabric. The pollution is not caused in a process of manufacturing the electric conductive sheet. Since the electric conductive sheet is completely decomposed, it does not pollute the environment when being destroyed.

Additionally, the electric conductive gasket has an advantage in that the electric conductive sheet has the wholly embossed surface to reduce the wrinkle of the electric conductive sheet, and the electric conductive sheet has a substantially increased surface area due to the embossing pattern to improve an effect of electronic-wave shielding.

Additionally, the electric conductive gasket has an advantage in that since aluminum is used instead of nickel, a skin trouble such as allergy is generated, and since the oxidation preventing film can be easily formed on the surface of the aluminum foil, the surface of the aluminum foil is discolored and a predetermined electric conductivity can be maintained.

Further, the electric conductive gasket can be completely recycled, and the electric conductive sheet can be recycled.

Furthermore, the electric conductive gasket has an advantage in that aluminum with an average thickness of 7 µm has a low electric resistance and an excellent thermal conductivity in comparison with the conventional conductive fabric.

BRIEF DESCRIPTION OF THE DRAWINGS

The above object, other features and advantages of the present invention will become more apparent by describing the preferred embodiment thereof with reference to the accompanying drawings, in which.

DETAILED DESCRIPTION OF THE INVENTION

Figure 1:
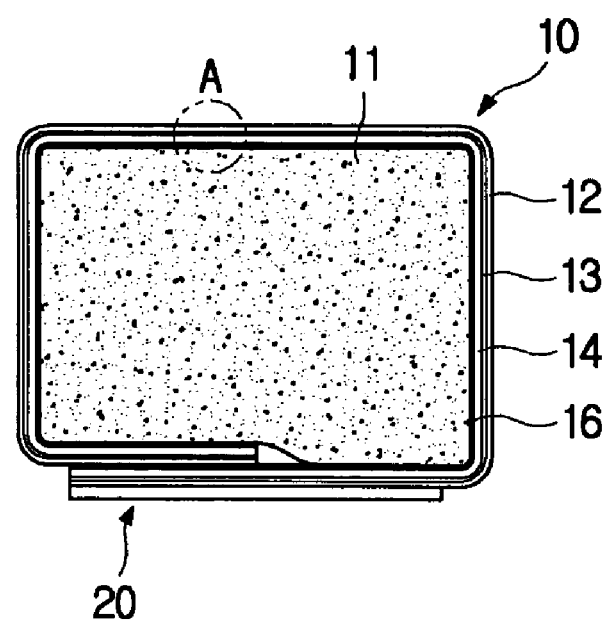
FIG. 1 is a sectional view illustrating an electric conductive gasket according to an embodiment of the present invention.
Figure 2:
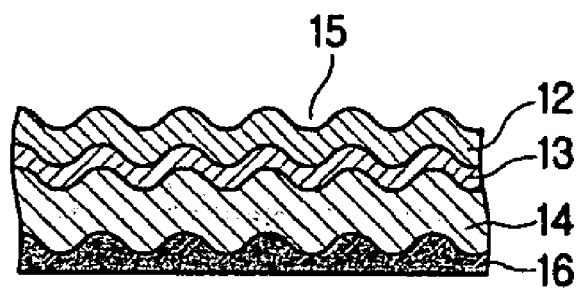
FIG. 2 is an enlarged sectional view illustrating "A" portion of FIG. 1.

FIG. 1 is a sectional view illustrating an electric conductive gasket according to an embodiment of the present invention, and FIG. 2 is an enlarged sectional view illustrating "A" portion of FIG. 1.

Referring to FIGS. 1 and 2, an electric conductive sheet has an aluminum foil 12 that is adhered to a surface of a natural pulp base 14 by using an adhesive 13, and a hot melt layer 16 that is formed on the other surface of the natural pulp base 14. The electric conductive sheet is overlapped to continuously encompass a polymer sponge 11 such as a nonconductive urethane sponge or a latex sponge, thereby forming an electric conductive gasket 10.

Since a low-priced aluminum foil 12 is formed on the natural pulp base 14, the electric conductive gasket 10 has an advantage in that it takes a half of a conventional manufacture cost.

As the natural pulp base 14, a natural-pulp nonweaven fabric or a natural-pulp paper can be used. The natural-pulp nonweaven fabric or the natural-pulp paper according to the present invention is not melt by heat. Therefore, even though the electric conductive gasket 10 is heated, the aluminum foil 12 can be maintained in an original shape.

Since the adherence of the aluminum foil 12 by using the adhesive 13 is a technique well known in the related art, a particular equipment or technique is not needed. For example, an oxygen-based adhesive can be used in an emulsion type to adhere the aluminum foil to the natural pulp base using a lamination method. At this time, an adhesive with a great strength can be also used to provide a great tensile strength of the natural pulp.

The soft aluminum foil can be used as a covering material of the gasket due to its low tensile strength, good extension rate and flexibility. The soft aluminum foil 12 can be manufactured through a process of reducing an aluminum in thickness by 50% at each cold rolling to form a thickness of 5 to 15 microns, and then heat-treating for about two hours in a furnace of a temperature of about 300° C.

Preferably, the aluminum containing Si+Fe of 0.7% or more, Cu of 0.1% or more, and Al of 99% or more may be used to provide electric conductivity of an electronic-wave shielding material and a performance of corrosion resistance and flexibility.

Further, since the aluminum is easily oxidized by Hydrogen and Alkali, it is desirable that after the forming of the soft aluminum foil using a heat-treatment, a flexible oxidation preventing foil is formed at a thickness of about 26 Å, thereby preventing corrosion (Referring to Nature Phys. Science p 244, 1973). As a result, the electric conductivity can be maintained.

Since a base is formed of a natural pulp, pollution is not generated when the electric conductive sheet is manufactured. Further, since the natural pulp base is completely decomposed, it does not cause environment pollution even when being destroyed, and it can be completely recycled when being recycling.

Specifically, since the present invention has an electric surface resistance of 0.008Ω/□ or less to the maximum in comparison with an electric conductive fabric having an average of an electric surface resistance of 0.04Ω/□, the present invention has an advantage of an excellent electronic-wave shielding effect and grounding effect, and a fast heat transfer.

Preferably, the electric conductive sheet, which has the natural pulp base 14 and the aluminum foil 12 adhered using the adhesive 13 to each other, is embossed at its whole surface to have a concavo-convex shaped section as shown in FIG. 2. That is, the natural pulp base 14, the aluminum foil 12 and the adhesive 13 are concurrently embossed and the hot melt layer 16 is absorbingly adapted to the concavo-convex shape to have a planarized contact surface with the polymer sponge 11. As described above, an embossing pattern 15 can be formed using a mechanical compressing method such as a roller in the aluminum foil 12 adhered to the natural pulp base 14.

Since the aluminum has softness, it can be processed to a gasket due to its flexibility, and can be embossed by a mechanical press.

Further, it tends that the natural pulp paper is mechanically embossed due to its weak elasticity comparing with a synthetic resin film. That is, it is difficult that the synthetic resin film such as a polyester film is mechanically embossed comparing with the natural pulp. Further, it tends that the concavo-convex shape is removed from a surface of the synthetic resin film through a melting process of the synthetic resin film using heat applied when the gasket being manufactured.

To the contrary, since the natural pulp paper is not melted by heat, it is not deformed by heat applied when the gasket is manufactured.

As such, the electric conductive sheet has the embossing pattern 15 to reduce wrinkling. The electric conductive sheet has a substantially increased surface area due to the embossing pattern 15 to improve an effect of electronic-wave shielding.

Preferably, the electric conductive sheet has a thickness of 150 μm or less. Specifically, in order to prevent the wrinkling, the natural pulp base 14 is formed to have a thickness greater than the aluminum foil 12. For example, it is appropriate that the aluminum foil 12 has a thickness of 5 μm to 15 μm, the natural pulp base 14 has a thickness of 40 μm to 130 μm, and the adhesive layer 13 has a thickness of 2 μm to 3 μm.

In comparison with the conventional electric conductive fabric having a plating thickness of about 3 μm, the present invention has an advantage of the low electric resistance and an improved thermal conductivity due to a greater thickness of the aluminum foil.

A procedure of manufacturing the gasket using the electric conductive sheet according to the present invention is described as follows. After the electric conductive sheet continuously encompasses the polymer sponge 11, it is heated. If so, the hot melt layer 16 is melted to combine the natural pulp base 14 and the polymer sponge 11. For example, the hot melt layer can use an Ethylene Vinyl Acetate (EVA)-based material, and can preferably have a thickness of 30 μm to 50 μm.

At this time, since the natural pulp base is not melted even though being heated as described above, the aluminum foil adhered to the natural pulp base can be maintained to have an original shape, and the embossing pattern integrated with the aluminum foil is maintained in its original shape.

Figure 4:
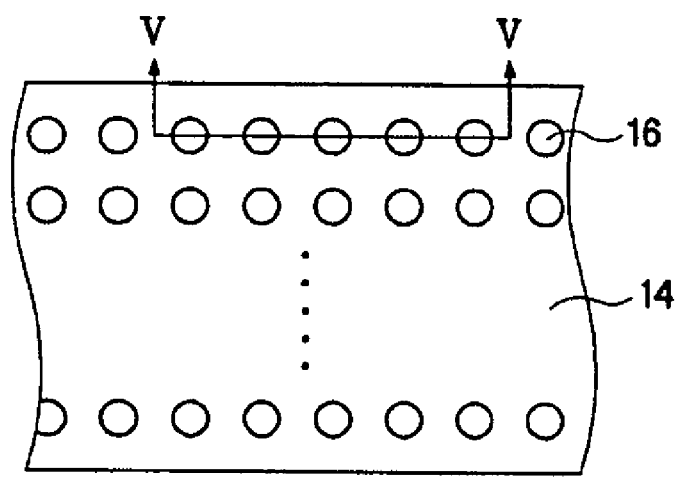
FIG. 4 is a bottom view illustrating a modified example of a hot melt according to the present invention.
Figure 5:
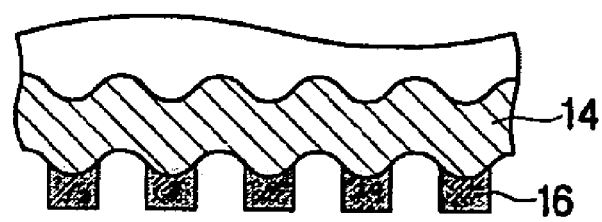
FIG. 5 is a sectional view taken along line V-V of FIG. 4.

FIG. 4 is a bottom view illustrating a modified example of a hot melt according to the present invention, and FIG. 5 is a sectional view taken along line V-V of FIG. 4.

Here, the hot melts 16 are regularly arrayed in a dot shape on the natural pulp base 14. The dot shape can be varied such as a circular shape or a rectangular shape.

In case where the gasket of FIG. 1 is cut at a predetermined length, the edges of the electric conductive sheet facing with each other along a cut direction of a cut section are adhered with each other, thereby causing a poor appearance and consequently deteriorating workability.

However, the hot melts 16 are arrayed in the dot shape to prevent the facing edges from being adhered to each other. That is, as shown in FIG. 5, the dot-shaped hot melts 16 are spaced apart by a predetermined distance. Accordingly, even though the hot melts 16 faces up and down with each other, an attachment possibility of the hot melts 16 is reduced due to a space provided therebetween.

Further, since the used hot melt 16 is reduced in amount comparing to a conventional art, there is an advantage in that a manufacture cost is reduced. Furthermore, the same amount of the coated hot melt 16 can have a larger height than the conventional art. For example, comparing to the conventional hot melt having a thickness of 40 μm, the present invention can form the hot melt layer in the dot shape having a height of about 60 μm by the same amount of hot melt.

Additionally, if the hot melt is heated and molten at the time of attachment, the hot melt layer has a total sectional profile with a curved shape. Accordingly, the target object (polymer sponge) is adaptively deformed to the curved shape for attachment, the adhesive strength is more increased.

Referring to FIG. 1, the inventive electric conductive gasket 10 can be inserted into a mechanical groove of a target object to be adjoined to the target object such as an electronic apparatus or a communication apparatus, or be adhered to the target object by using a double-coated conductive pressure sensitive adhesive tape.

Figure 3:
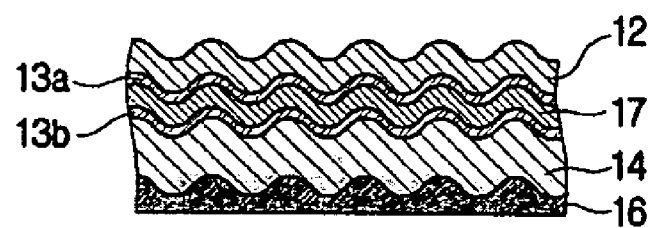
FIG. 3 is a sectional view illustrating an electric conductive gasket according to another embodiment of the present invention.

FIG. 3 is a sectional view illustrating an electric conductive gasket according to another embodiment of the present invention.

According to this embodiment, a PET film 17 is inserted and adhered using adhesives 13a and 13b between the aluminum foil 12 and the natural pulp base 14.

According to the embodiment of FIG. 2, in case where the natural pulp base 14 is applied, there is a great possibility in which the natural pulp base 14 is easily destroyed by an external physical force due to its weak tensile strength. Therefore, the PET film 17 can be inserted and adhered to improve the tensile strength.

While the present invention have been described in detail with reference to the preferred embodiments, those skilled in the art will appreciate that various modifications and substitutions can be made thereto without departing from the spirit and scope of the present invention as set forth in the appended claims.

For example, it is natural that the present invention can be varied to have a format suitable to a position, and other elastic members can be used instead of the polymer sponge.

What is claimed is:

1. An electric conductive gasket capable of shielding an electromagnetic wave, comprising:
   an electric conductive sheet having a natural pulp base, a soft aluminum foil adhered to a surface of the natural pulp base with an adhesive applied therebetween, an oxidation preventing coating formed on an outer exposed surface of the soft aluminum foil, and a hot melt resin layer formed on the other surface of the natural pulp base; and
   a nonconductive elastic member surrounded by the electric conductive sheet.

2. The gasket of claim 1, wherein the natural pulp base has a natural pulp nonweaven fabric or a natural pulp paper.

3. The gasket of claim 1, wherein the electric conductive sheet has a thickness of 150 μm or less, and the natural pulp base has a thickness greater than the aluminum foil.

4. The gasket of claim 3, wherein the natural pulp base has a thickness of 40 μm to 130 μm, the aluminum foil has a thickness of 5 μm to 15 μm, and the adhesive has a thickness of 2 μm to 3 μm.

5. The gasket of claim 1, wherein the elastic member is a polymer sponge having a urethane sponge or a latex sponge.

6. The gasket of claim 1, further comprising: a PET polymer film inserted and adhered by an adhesive between the natural pulp base and the soft aluminum foil.

7. The gasket of claim 1, wherein the aluminum foil and the natural pulp base of the electric conductive sheet are embossed and integrally adhered to each other.

8. The gasket of claim 1, wherein the oxidation preventing coating has a thickness of approximately 29 Å.

9. The gasket of claim 1, wherein the aluminum foil is formed of a purity of 99% or more of aluminum.

10. The gasket of claim 1, wherein the hot melt layer is formed by arraying hot melt in a dot shape.

11. An electric conductive sheet for electromagnetic wave shielding, the electric conductive sheet comprising:
a natural pulp paper;
a soft aluminum foil being adhered to a surface of the natural pulp paper with an adhesive applied therebetween, and having an outer surface on which an oxidation preventing coating is formed; and
a hot melt layer formed on the other surface of the natural pulp paper.

12. The electric conductive sheet of claim 11, further comprising: a PET polymer film inserted and adhered by an adhesive between the natural pulp base and the soft aluminum foil.

13. An electric conductive sheet for electromagnetic wave shielding, the electric conductive sheet comprising:
a natural pulp paper;
a soft aluminum foil being adhered to a surface of the natural pulp paper with an adhesive applied therebetween, and having an outer surface on which an oxidation preventing coating is formed; and
a hot melt layer formed on the other surface of the natural pulp paper,
wherein the outer surface of the soft aluminum foil is embossed.

14. The electric conductive sheet of claim 13, further comprising: a PET polymer film inserted and adhered by an adhesive between the natural pulp base and the soft aluminum foil.

* * * * *